United States Patent
Sakaguchi et al.

[11] Patent Number: 6,054,363
[45] Date of Patent: *Apr. 25, 2000

[54] METHOD OF MANUFACTURING SEMICONDUCTOR ARTICLE

[75] Inventors: Kiyofumi Sakaguchi, Yokohama; Takao Yonehara, Atsugi; Tadashi Atoji, Machida, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/968,664

[22] Filed: Nov. 12, 1997

Related U.S. Application Data

[63] Continuation of application No. 08/968,664, Nov. 12, 1997.

[30] Foreign Application Priority Data

Nov. 15, 1996 [JP] Japan .................................. 8-304539

[51] Int. Cl.⁷ .................................................. H01L 21/76
[52] U.S. Cl. ........................ 438/406; 438/409; 438/745; 438/753
[58] Field of Search .................. 438/745, 753, 438/406, 409, 960

[56] References Cited

U.S. PATENT DOCUMENTS

| | | | |
|---|---|---|---|
| 4,816,420 | 3/1989 | Bozler . | |
| 5,371,037 | 12/1994 | Yonehara | 437/86 |
| 5,374,564 | 12/1994 | Bruel | 437/24 |
| 5,405,802 | 4/1995 | Yamagata et al. | 437/71 |
| 5,492,859 | 2/1996 | Sakaguchi et al. | 437/86 |
| 5,750,000 | 5/1998 | Yonehara et al. | 156/630 |
| 5,840,616 | 11/1998 | Sakaguchi et al. | 438/459 |
| 5,856,229 | 1/1999 | Sakaguchi et al. | 438/406 |

FOREIGN PATENT DOCUMENTS

| | | | |
|---|---|---|---|
| 0793263 | 9/1997 | European Pat. Off. | H01L 21/20 |
| 05-21338 | 1/1993 | Japan . | |
| 05211128 | 8/1993 | Japan . | |
| 07302889 | 11/1995 | Japan . | |
| 08213645 | 8/1996 | Japan . | |

OTHER PUBLICATIONS

K. Barla, "SOI Technology Using Buried Layers of Oxidized Porous Si", IEEE Circuits and Devices Magazine, Nov. 1987, pp. 11–15.

K. Imai, "A New Dielectric Isolation Method Using Porous Silicon", Solid–State Electronics, vol. 24, No. 2, Feb. 1, 1981, pp. 159–164.

Imai, "Crystalline Quality of Silicon Layer Formed by FIPOS Technology", *J. Crystal Growth,* vol. 63, No. 3, pp. 547–553 (1983).

Maszara, "Silicon–On–Insulator by Wafer Bonding: A Review", *J. Electrochem. Soc.,* vol. 138, No. 1, pp. 341–347 (1991).

Harendt, "Silicon on Insulator Material by Wafer Bonding", *J. Elect. Mater.,* vol. 20, No. 3, pp. 267–277 (1991).

(List continued on next page.)

*Primary Examiner*—Benjamin Utech
*Assistant Examiner*—Kin-Chan Chen
*Attorney, Agent, or Firm*—Fitzpatrick, Cella, Harper & Scinto

[57] ABSTRACT

A method of manufacturing a semiconductor article comprises steps of preparing a first substrate including a silicon substrate having a porous silicon layer and a nonporous semiconductor layer arranged on the porous silicon layer, bonding the first substrate and a second substrate to produce a multilayer structure with the nonporous semiconductor layer located inside, separating the first and second substrates of the multilayer structure from each other along the porous silicon layer by heating the multilayer structure and removing the porous silicon layer remaining on the separated second substrate.

29 Claims, 4 Drawing Sheets

OTHER PUBLICATIONS

Baumgart, "Light Scattering Topography Characterization of Bonded SOI Wafers", Extended Abstract of ECS First International Symposium of Wafer Bonding, pp. 375–385 (1991).

Hunt, "Thinning of Bonded Wafers: Etch–Stop Approaches", Extended Abstract of ECS First International Symposium of Wafer Bonding, pp. 165–173 (1991).

Yonehara, "Epitaxial layer transfer by bond and etch back of porous Si", *Appl. Phys. Lett.*, vol. 64, No. 16, pp. 2108–2110 (1994).

Uhlir, "Electrolytic Shaping of Germanium and Silicon", *Bell Syst. Tech. J.*, vol. 35, pp. 333–347 (1956).

Unagami, "Formation Mechanism of Porous Silicon Layer by Anodization in HF Solution", *J. Electrochem. Soc.*, vol. 127, No. 2, pp. 476–483 (1980).

VanVeen, "Helium–Induced Porous Layer Formation in Silicon", Mat. Res. Soc. Symp. Proc., vol. 107, pp. 449–454 (1987).

Raineri, "Silicon–on–insulator produced by helium implantation and thermal oxidation", *Appl. Phys. Lett.*, vol. 66, No. 26, pp. 3654–3656 (1995).

METHOD OF MANUFACTURING SEMICONDUCTOR ARTICLE

This is a continuation of U.S. application Ser. No. 08/968,664 filed on Nov. 12, 1997.

BACKGROUND OF THE INVENTION

1. Field of the Invention

This invention relates to a method of manufacturing a semiconductor article that can suitably be used for producing a semiconductor device such as a semiconductor integrated circuit, a solar cell, a semiconductor laser device or a light emitting diode. More particularly, it relates to a method of manufacturing a semiconductor article comprising a step of transferring a semiconductor layer onto a substrate.

2. Related Background Art

Semiconductor articles are popular in terms of semiconductor wafers, semiconductor substrates and various semiconductor devices and include those adapted for producing semiconductor devices by utilizing the semiconductor region thereof and those used as preforms for producing semiconductor devices.

Some semiconductor articles of the type under consideration comprise a semiconductor layer arranged on an insulator.

The technology of forming a single crystal silicon semiconductor layer on an insulator is referred to as silicon on insulator (SOI) technology, which is widely known. Various research has been done to exploit the remarkable advantages of SOI that cannot be achieved by using the bulk Si substrates that are used for producing ordinary Si integrated circuits. The advantages of the SOI technology include:

1. the ease of dielectric isolation that allows an enhanced degree of integration;
2. the excellent resistivity against radiation;
3. a reduced floating capacitance that allows a high device operation speed;
4. the omission of the well forming step;
5. the effect of latch up prevention; and
6. the possibility of producing fully depleted field effect transistors using the thin film technology. The advantages of the SOI technology are thoroughly discussed in the Special Issue: "Single-crystal silicon on non-single-crystal insulators"; edited by G. W. Cullen, Journal of Crystal Growth, volume 63, No. 3, pp. 429–590 (1983).

In recent years, a number of reports have been published on the SOI technology for providing substrates that can realize high speed operation and low power consumption for MOSFETs (IEEE SOI conference 1994). The process of manufacturing a semiconductor device can be significantly shortened by using the SOI structure if compared with the corresponding process of manufacturing a device on a bulk Si wafer, because of the implementation of a very simplified device isolation step. Thus, the use of the SOI technology can provide a significant cost reduction in manufacturing a semiconductor device, particularly in terms of the wafer cost and the process cost if viewed from the conventional technology of manufacturing a MOSFET or an IC on a bulk Si substrate, to say nothing of the remarkable performance of such a semiconductor device.

Fully depleted MOSFETs are very promising for achieving high speed operation and low power consumption if provided with improved drive power. Generally speaking, the threshold voltage (Vth) of a MOSFET is determined as a function of the impurity concentration of its channel section but, in the case of a fully depleted (FD) MOSFET, the characteristics of the depletion layer are influenced by the SOI film thickness. Therefore, the SOI film thickness has to be rigorously controlled in order to improve the yield of manufacturing LSIs.

Meanwhile, a device formed on a compound semiconductor shows a remarkable level of performance that cannot be expected from silicon, particularly in terms of high speed operation and light emission. Such devices are currently formed by means of epitaxial growth on a compound semiconductor substrate that may be made of GaAs or a similar compound. However, a compound semiconductor substrate is costly and mechanically not very strong, so that it is not adapted to produce a large wafer.

Thus, efforts have been made to form a compound substrate by hetero-epitaxial growth on a Si wafer that is inexpensive, mechanically strong and good for producing a large wafer.

Research on forming SOI substrates became significant in the 1970s. Initially, attention was paid to the technique of producing single crystal silicon by epitaxial growth on a sapphire substrate (SOS: silicon on sapphire), that of producing an SOI structure through full isolation by porous oxidized silicon (FIPOS) and the oxygen ion implantation technique. The FIPOS method comprises steps of forming an islanded N-type Si layer on a P-type single crystal Si substrate by proton/ion implantation (Imai et al., J. Crystal Growth, Vol. 63,547 (1983)) or by epitaxial growth and patterning, transforming only the P-type Si substrate into a porous substrate by anodization in a HF solution, shielding the Si islands from the surface, and then subjecting the N-type Si islands to dielectric isolation by accelerated oxidation. This technique is, however, accompanied by a problem that the isolated Si region is defined before the process of producing devices, therefore restricting the freedom of device design.

The oxygen ion implantation method is also referred to as the SIMOX method, which was proposed by K. Izumi for the first time. With this technique, oxygen ions are implanted into a Si wafer to a concentration level of $10^{17}$ to $10^{18}/cm^2$ and then the latter is annealed at high temperature of about 1,320° C. in an argon/oxygen atmosphere. As a result, the implanted oxygen ions are chemically combined with Si atoms to produce a silicon oxide layer that is centered at a depth corresponding to the projection range (Rp) of the implanted ions. Under this condition, an upper portion of the Si oxide layer that is turned into an amorphous state by the oxygen ion implantation is recrystallized to produce a single crystal Si layer. While the surface Si layer used to show a defect rate as high as $10^5/cm^2$, a recent technological development has made it possible to reduce the defect rate down to about $10^2/cm^2$ by selecting a rate of oxygen implantation of about $4\times10^{17}/cm^2$. However, the allowable range of energy infusion and that of ion implantation are limited if the film quality of the Si oxide layer and the crystallinity of the surface Si layer are to be held to respective desired levels and hence the film thickness of the surface Si layer and that of the buried Si oxide (BOX; buried oxide) layer are allowed to take only limited values. In other words, a process of sacrifice oxidation or epitaxial growth is indispensable to realize a surface Si layer having a desired film thickness. Such a process, in turn, gives rise to a problem of uneven film thickness due to the intrinsic adverse effect of the process.

There have been reports saying that SIMOX can produce defective Si oxide regions in the Si oxide layer that are referred to as pipes. One of the possible causes of the phenomenon may be foreign objects such as dust introduced into the layer at the time of ion implantation. The device produced in a pipe region can show degraded characteristics due to the leak current between the active layer and the underlying substrate.

The SIMOX technique involves the use of a large volume of ions that is by far greater than the volume used in the ordinary semiconductor process and hence the ion implantation process may take a long time if a specifically designed apparatus is used for it. Since the ion implantation process is performed typically by means of raster scan of an ion beam showing a predetermined flow rate of electric current or by spreading an ion beam, a long time may be required for processing a large wafer. Additionally, when a large wafer is processed at high temperature, the slip problem due to an uneven temperature distribution within the wafer can become very serious. Since the SIMOX process requires the use of extraordinary high temperature that is as high as 1,320° C., which is not observed in the ordinary Si semiconductor process, the problem of uneven temperature distribution will become more serious if a large wafer has to be prepared unless a highly effective apparatus is not realized.

Beside the above-described known techniques of forming SOI, a technique of bonding a single crystal Si substrate to another single crystal Si substrate that has been thermally oxized to produce an SOI structure has been proposed recently. This method requires the use of an active layer having an even thickness for the devices to be formed on it. More specifically, a single crystal Si substrate that is as thick as several hundred micrometers has to be made as thin as several micrometers or less. Three techniques have been known for thinning a single crystal Si layer that include:

(1) polishing;
(2) local plasma etching; and
(3) selective etching.

It is difficult to achieve an even film thickness by means of the polishing technique. Particularly, the mean deviation in the film thickness can be as large as tens of several percent to make the technique unfeasible when the film is thinned to an order of sub-micrometer. This problem will become more significant for wafers having a large diameter.

The technique of local plasma etching is typically used in combination with that of polishing. More specifically, the film is thinned by means of polishing to about 1 to 3 $\mu$m and the distribution of film thickness is determined by observing the film thickness at a number of points. Then, the film is subjected to an etching operation where the film is scanned with plasma of $SF_6$ particles having a diameter of several millimeters, correcting the distribution of film thickness, until a desired film thickness is obtained. There has been a report that the distribution of film thickness can be confined within about ±10 nm or less by means of this technique. However, this process is accompanied by a drawback that, if foreign objects are present on the substrate in the form of particles during the plasma etching, they operate as etching masks to produce projections on the substrate when the etching operation is over.

Additionally, since the substrate shows a coarse surface immediately after the etching operation, a touch-polishing operation has to be conducted on the surface after the end of the plasma etching and the operation is controlled only in terms of its duration. Then, again the problem of deviations in the film thickness due to polishing arises. Still additionally, a polishing agent typically containing colloidal silica is used for the polishing operation and hence the layer for making an active layer is directly scraped by the polishing agent so that a crushed and/or distorted layer may be produced. The throughput of the process can be significantly reduced when large wafers are treated because the duration of the plasma etching operation is prolonged as a function of the surface area of the wafer being processed.

Selective etching involves the use of a film configuration for the substrate to be thinned that comprises one or more film layers adapted to selective etching. For example, assume that a $P^+$-Si thin layer containing boron by more than $10^{19}/cm^3$ and a P-type Si thin layer are made to grow sequentially on a P-type substrate by means of epitaxial growth to produce a first substrate, which is then bonded to a second substrate with an insulation layer interposed therebetween, the insulation layer being typically an oxide film, and that the rear surface of the first substrate is made sufficiently thin in advance by scraping and polishing. Subsequently, the $P^+$-layer is exposed by selectively etching the overlying P-type layer and then the P-type substrate is exposed by selectively etching the $P^+$-layer to produce an SOI structure. This technique is discussed in detail in a report by Maszara (W. P. Maszara, J. Electrochem. Soc., Vol. 138,341 (1991)).

While the selective etching technique is effective for producing a thin film with an even film thickness, it is accompanied by the drawbacks as identified below.

The selective etching ratio is not satisfactory and will be as low as $10^2$ at most.

A touch-polishing operation is required to smooth the surface after the etching operation because of the coarse surface produced by the etching operation. Therefore, the film thickness can lose the uniformity as it is reduced by polishing. Particularly, while the polishing operation is controlled by the duration of the operation, it is difficult to rigorously control the operation because the polishing rate can vary significantly from time to time. Thus, this problem becomes significant when forming an extremely thin SOI layer that is as thin as 100 nm.

The produced SOI layer can show a poor crystallinity due to the use of a film forming technique that involves ion implantation and epitaxial or hetero-epitaxial growth on a Si layer that is densely doped with B. Additionally, the bonded surface of the substrate may show a degree of smoothness that is inferior relative to that of a conventional Si wafer (C. Harendt, et al., J. Elect. Mater. Vol. 20,267 (1991), H. Baumgart, et al., Extended Abstract of ECS first International Symposium of Wafer Bonding, pp-733 (1991), C. E. Hunt, Extended Abstract of ECS first International Symposium of Wafer Bonding, pp-696 (1991)). Still additionally, there is a problem that the selectivity of the selective etching technique heavily depends on the concentration difference among the impurities such as boron contained in the substrate and the steepness of the concentration profile of the impurities along the depth of the substrate. Therefore, if the bonding anneal is conducted at high temperature to improve the bonding strength of the layers and the epitaxial growth is carried out also at high temperature to enhance the crystallinity of the SOI layer, the concentration profile of the impurities along the depth becomes flattened to reduce the selectivity of the etching operation. Simply stated, the improvement of the etching selectivity and hence that of the crystallinity and the improvement of the bonding strength are conflicting requirements that cannot be met at the same time.

Under these circumstances, the inventors of the present invention proposed a novel method of manufacturing a semiconductor article in Japanese Patent Application Laid-Open No. 5-21338. According to the invention, the proposed method is characterized by forming an article by arranging a nonporous single crystal semiconductor region on a porous single crystal semiconductor region, bonding the surface of a material carrying an insulating material thereon to the corresponding surface of said porous single crystal semiconductor region and subsequently removing said porous single crystal semiconductor region by etching.

T. Yonehara et al., who are the inventors of the present invention, also reported a bonded SOI that is excellent in terms of even film thickness and crystallinity and adapted to batch processing (T. Yonehara et al., Appl. Phys. Lett. Vol. 64,2108 (1994)). Now, the proposed method of manufacturing a bonded SOI will be summarily described below by referring to FIGS. 3A through 3C of the accompanying drawings.

The proposed method uses a porous layer 32 formed on a first Si substrate 31 as a layer to be selectively etched. After forming a nonporous single crystal Si layer 33 on the porous layer 32 by epitaxial growth, it is bonded to a second substrate 34 with a Si oxide layer 35 interposed therebetween (FIG. 3A). Then, the porous Si layer is exposed over the entire surface area of the first substrate by scraping off the first substrate from the rear side (FIG. 3B). The exposed porous Si is then etched out by means of a selective etching solution typically containing KOH or $HF+H_2O_2$ (FIG. 3C). Since the selective etching ratio of the operation of etching the porous Si layer relative to the bulk Si layer (nonporous single crystal Si layer) can be made as high as hundreds of thousands with this technique, the nonporous single crystal Si layer formed on the porous layer in advance can be transferred onto the second substrate to produce a SOI substrate without reducing the thickness of the nonporous single crystal Si layer. Thus, the uniformity of the film thickness of the SOI substrate is determined during the epitaxial growth step. According to a report by Sato et al., since a CVD system adapted to an ordinary semiconductor process can be used for the epitaxial growth, a degree of uniformity of the film thickness as high as 100 nm±2% can be realized. Additionally, the epitaxial Si layer shows an excellent crystallinity of about $3.5 \times 10^2/cm^2$.

Since the selectivity of any conventional selective etching technique heavily depends on the concentration difference among the impurities contained in the substrate and the steepness of the concentration profile of the impurities along the depth of the substrate as described above, the temperature of the heat treatment (for bonding, epitaxial growth, oxidation and so on) is limited to as low as 800° C. at most because the impurity concentration profile becomes flattened above that temperature limit. On the other hand, the etching rate of the proposed etching technique is mainly determined by the structural difference between the porous layer and the bulk layer so that the heat treatment is not subjected to such a rigorous limitation and temperature as high as 1,180° C. can be used. It is known that a heat treatment process conducted after the bonding operation can remarkably improve the bonding strength between wafers and reduce the size and number of voids on the bonding interface. Additionally, with a selective etching operation depending the structural difference between the porous layer and the bulk layer, the uniformity of the film thickness is not adversely affected by fine particles that can be adhering to the porous Si layer.

However, a semiconductor substrate produced by a bonding process inevitably requires at least two wafers as starting materials, one of which is substantially wasted away in the course of polishing and etching to consume the limited natural resources almost for nothing. In other words, a SOI manufacturing process is required to realize low cost and economic feasibility in addition to an enhanced degree of process controllability and an improved uniformity of the film thickness.

Differently stated, the requirements of a process for manufacturing a high quality SOI substrate include an excellent reproducibility, an enhanced level of resource saving capability through the repeated use of a same wafer and low manufacturing cost.

Under these circumstances, the inventors of the present invention proposed in Japanese Patent Application Laid-Open No. 7-302889 a method of manufacturing a semiconductor substrate, with which a pair of substrates are bonded together and subsequently separated from each other through a porous layer arranged therebetween so that one of the substrates may be reused by removing the porous substance remaining on it. The disclosed method will now be summarily described below by referring to FIGS. 4A through 4C of the accompanying drawings.

It comprises steps of forming a porous layer 42 by transforming a surface layer of a first Si substrate 41 into a porous state, forming a single crystal Si layer 43 on the porous layer, bonding the single crystal Si layer to the main surface of a second Si substrate 44 with an insulation layer 45 interposed therebetween (FIG. 4A). It further comprises steps of separating the wafers bonded together with the porous layer arranged therebetween (FIG. 4B) and selectively removing the exposed porous Si layer on the surface of the second Si substrate to produce a SOI substrate (FIG. 4C). With this method, the first substrate 41 can be reused after removing the residual porous layer. The bonded wafers may be separated from each other typically by way of one of the following techniques;

applying sufficiently strong tensile force or pressure onto a surface of the combined wafers along a direction perpendicular to the surface;

applying wave energy in the form of an ultrasonic wave or the like to the combined wafers;

causing the porous layer to be exposed at an end surface of the combined wafers, etching the porous Si layer to a certain extent and inserting the edge of a blade;

causing the porous layer to be fully exposed at an end surface of the wafers, soaking the porous Si layer with liquid that may be water and causing the liquid to expand by entirely heating or cooling the combined wafers; and applying force to the first (or second) substrate along a direction parallel to the second (or first) substrate in order to destroy the porous Si layer.

The above listed techniques are based on the idea that, while the mechanical strength of the porous Si layer depends on the porosity of the layer, it is sufficiently lower than that of a bulk Si layer. As a rule of thumb, a porous Si layer having a porosity of 50% shows a mechanical strength about a half of that of a corresponding bulk Si layer. In short, when a pair of bonded wafers is subjected to compressive, tensile or shearing force, the porous Si layer will be destroyed to begin with. A porous layer showing a higher degree of porosity can be destroyed with less force.

However, in reality, efforts have been paid to reduce the porosity of the surface layer of the porous Si in order to realize an excellent epitaxial growth in terms of the quality of the device formed on the SOI substrate, while increasing the porosity of the inside of the porous Si for easy separation of the bonded wafers. Thus, as described in an example disclosed in Japanese Patent Application Laid-Open No.

7-302889, it has been a known practice to modify the porosity of the porous Si layer by controlling the electric current used in an anodization process.

On the other hand, Japanese Patent Application Laid-Open No. 8-213645 discloses a method of mechanically destroying a porous Si layer in order to separate a device forming layer from a substrate to which the former has been bonded, although it does not describe the configuration of the porous layer. Anyhow, conventionally, a pair of bonded substrates are separated along a porous layer arranged therebetween either by mechanically destroying the porous layer or by controlling the electric current used in an anodization process to modify the porosity of the porous layer.

Of these, the technique of applying external force to the bonded wafers to separate them along the porous layer disposed therebetween can result in unintended separation of the wafers along the bonded surfaces thereof if the bonding strength holding the wafers together is smaller than the mechanical strength of the porous Si layer or if the porous layer has one or more than one mechanically weak local regions. If a technique that does not involve a bonding process is employed, the process of separating the wafers along the porous layer has to be controlled rigorously in order to separate them mechanically without fail.

Japanese Patent Application Laid-Open No. 5-211128 proposes a method of separating a pair of bonded wafers comprising a step of forming a bubble layer by ion implantation and a subsequent step of crystal rearrangement and cohesion of bubbles by heat treatment so that the wafers may be peeled off from each other along the bubble layer. However, this method is accompanied by a problem of difficulty with which the heat treatment is optimized and the use of a low temperature range between 400 and 600° C. It is not possible to suppress the above-described generation of voids with such a low temperature range, which voids cannot be eliminated if the bonded wafers are subjected to another heat treatment process after the formation of a thin film. In other words, the reduction in the size and number of voids is a phenomenon that appears when the pair of bonded wafers are heat treated at high temperature and would not occur if the bonded wafers are heat treated after the formation of a thin film. The net result of such an additional heat treatment will be an increased strength of the zone binding the wafers together. Additionally, this method involves a step of polishing the surfaces of the substrates after they are peeled off from each other, which step can degrade the distribution of film thickness.

As described above, each of the known techniques of separating a substrate along a porous layer is accompanied by its specific problems that have to be dissolved to adapt itself to the rapidly expanding applications of the bonded SOI technology, which will be summarily described below.

A light transmitting substrate typically made of glass plays an important role in a contact sensor comprising a light receiving device or a projection type liquid crystal image display apparatus. A high performance drive device is required to realize a higher density, an enhanced resolution and an improved definition for the pixels arranged in such a sensor or a display apparatus. To meet this requirement, it is necessary to form a single crystal layer on a light transmitting substrate so that the devices arranged on the substrate may also show an excellent crystallinity. Additionally, the use of such a single crystal layer makes it possible to implement a peripheral circuit for driving pixels and a circuit for processing images on a substrate carrying the pixels on it in order to downsize the chip and increase its operating speed.

However, a light transmitting substrate typically of glass can carry thereon only a non-crystalline thin Si layer or a polycrystalline thin Si layer at best to reflect the disorganized crystal structure of the substrate and hence such a substrate is not adapted to high performance devices. This is principally because the substrate shows a non-crystalline structure and hence cannot produce a high quality single crystal layer on it if a Si layer is formed thereon by deposition.

In other words, a non-crystalline Si layer or a polycrystalline Si layer is not adapted to produce a drive circuit on it that operates satisfactorily because of its defective crystal structure. This is why there is an ever-increasing demand for an advanced SOI technology for producing SOI substrates including bonded SOI substrates.

Although the use of a compound semiconductor substrate is indispensable for manufacturing a compound semiconductor device, compound semiconductor substrates are costly and mechanically not strong so that they are not adapted to producing large wafers. Therefore, efforts have been paid to produce a compound semiconductor by hetero-epitaxial growth on a Si wafer that can easily be made to have a large surface area.

While research is being made to epitaxially grow a compound semiconductor such as GaAs on a Si substrate, the grown film typically shows a poor crystallinity and hence is poorly adapted to being used for semiconductor devices mainly due to the difference in the lattice constant and the thermal expansion coefficient between them.

Meanwhile, research is also being made to epitaxially grow a compound semiconductor on a porous Si layer in order to mitigate the above identified lattice misfit. However, a porous Si layer is thermally unstable and can change with time so that it is not stable or reliable as a substrate during and after the operation of forming devices thereon. Thus, there is a need for a technology of producing a bonded SOI substrate with which a compound semiconductor is made to epitaxially grow on a porous Si layer and the grown compound semiconductor is transferred onto another substrate.

SUMMARY OF THE INVENTION

In view of the above-described circumstances, it is therefore an object of the present invention to provide a method of manufacturing a semiconductor article comprising a step of bonding a pair of substrates, wherein part of the substrates is reused as raw material for manufacturing another semiconductor article.

Another object of the present invention is to provide a method of manufacturing a semiconductor article, characterized by comprising steps of preparing a first substrate including a silicon substrate having a porous silicon layer and a nonporous semiconductor layer arranged on the porous silicon layer, bonding the first substrate and a second substrate to produce a multilayer structure with the nonporous semiconductor layer located inside, separating the first and second substrates of the multilayer structure from each other along the porous silicon layer by heating the multilayer structure and removing the porous silicon layer remaining on the separated second substrate.

Still another object of the present invention is to provide a method of manufacturing a semiconductor article, characterized by preparing a first substrate including a silicon substrate having a porous silicon layer and a nonporous semiconductor layer arranged on the porous silicon layer, bonding the first substrate and a second substrate to produce a multilayer structure with the nonporous semiconductor layer located inside, separating the first and second substrates of the multilayer structure from each other along the porous silicon layer by heating the multilayer structure, removing the porous silicon layer remaining on the separated second substrate and reusing the substrate obtained by removing the porous layer remaining on the separated first substrate as material of another first substrate.

A further object of the present invention is to provide a method of manufacturing a semiconductor article, characterized by preparing a first substrate including a silicon substrate having a porous silicon layer and a nonporous semiconductor layer arranged on the porous silicon layer, bonding the first substrate and a second substrate to produce a multilayer structure with the nonporous semiconductor layer located inside, separating the first and second substrates of the multilayer structure from each other along the porous silicon layer by heating the multilayer structure, removing the porous silicon layer remaining on the separated second substrate and reusing the substrate obtained by removing the porous layer remaining on the separated first substrate as material for another second substrate.

With the known methods of separating the bonded substrates of a multilayer structure along the porous Si layer by externally applying pressure to the structure, the substrates would separate from each other along the interface that is mechanically not strong or has, if any, mechanically weak areas. To the contrary, the method according to the invention utilizes the fact that the porous Si layer is structurally fragile and comprises a step of heating the entire multilayer structure obtained by bonding a pair of substrates or at least the porous Si layer or its vicinity so that the substrates can be separated from each other along the porous Si layer with ease because of the thermal stress generated there and/or the mollified porous Si layer. Therefore, the configuration of the porous Si layer does not provide any problem. In other words, its porosity may be uniform or differentiated to stratify the layer in terms of porosity. Additionally, according to the invention, the porous Si layer can be subjected to internal pressure that is attributable to the thermal stress generated there by utilizing the fragility of porous Si so that the substrates may be separated along the porous Si layer in a well controlled manner.

With the known methods of manufacturing a substrate by bonding a pair of component substrates, the first substrate (Si substrate) is scraped or etched off gradually from a side thereof so that it is not allowed to bond the first substrate onto a support structure on either side. With the method of the present invention, to the contrary, the first substrate is allowed to maintain its original profile throughout the entire process except a surface layer so that it may be bonded onto a support structure on either side in such a way that a pair of multilayer structure substrates may be prepared by using a single first substrate to remarkably improve the manufacturing productivity. It will be appreciated that, with this arrangement, the first substrate can be reused after it is separated from the second substrate.

Additionally, with the method of the present invention, the first substrate can be separated from the second substrate by utilizing the porous layer that has a large area to reduce the time and cost required for the separating step and efficiently transfer a nonporous thin film that is a single crystal Si layer or a single crystal compound semiconductor layer having a very large and flat surface area and showing an excellent crystallinity. In other words, the method of the present invention provides a SOI structure comprising a single crystal Si layer formed on an insulation layer and having an even film thickness at high yield.

If laser is used as heating means for the purpose of the invention, only one or more than one specific layers can be made to absorb laser energy and become heated without heating the entire substrate obtained by bonding component substrates. More specifically, by selecting a laser beam having a wavelength that can be absorbed only by the porous Si layer or a layer located near the porous Si layer, the layer may be locally heated.

On the other hand, with the method of the present invention, the porous Si layer may be heated by causing an electric current to flow through the porous Si layer or along a plane located close to the porous Si layer.

According to the invention, the first substrate (Si substrate) can be reused after separating the porous Si layer substrate therefrom. Furthermore, this first substrate (Si substrate) may be reused for a number of times until it no longer be used due to a reduced mechanical strength.

The method according to the invention is free from scraping, polishing and etching steps that are indispensable for the comparable known methods for removing the first substrate and exposing the porous Si layer, because the two component substrates can be separated at a time along the porous layer having a large surface area according to the invention. Additionally, the plane along which the two component substrates are separated can be strictly defined to a given depth in the porous Si layer by implanting ions of at least one of a rare gas element, hydrogen and nitrogen with a projection range corresponding to the given depth in the porous Si layer so that the porous layer left on the second substrate shows an even thickness and can be removed uniformly by means of an etching solution with minimal selectivity.

Thus, according to the invention, a nonporous semiconductor layer (an Si layer, a compound layer or some other layer) having a large surface area, a even thickness and an excellent crystallinity can be formed economically on a second substrate (made of a semiconductor, an insulator or some other material).

Therefore, the present invention provides a method of manufacturing a semiconductor article comprising a nonporous semiconductor layer (which may be a single crystal Si layer or a single crystal compound semiconductor layer) formed on a transparent substrate (light transmitting substrate) and having a crystallinity comparable to a single crystal wafer that is excellent in terms of productivity, even thickness, controllability and cost.

Additionally, the present invention provides a semiconductor article comprising a single crystal semiconductor layer showing an evenly flat surface and an excellent crystallinity over a large area by means of a selective etching technique that can realize a remarkably high selective etching ratio.

Finally, the present invention provides a method of manufacturing a semiconductor article that can be used in place of costly SOS or SIMOX for preparing a large scale integrated circuit having a SOI structure.

DETAILED DESCRIPTION OF THE PREFERRED EMBODIMENTS

Figure 1A:
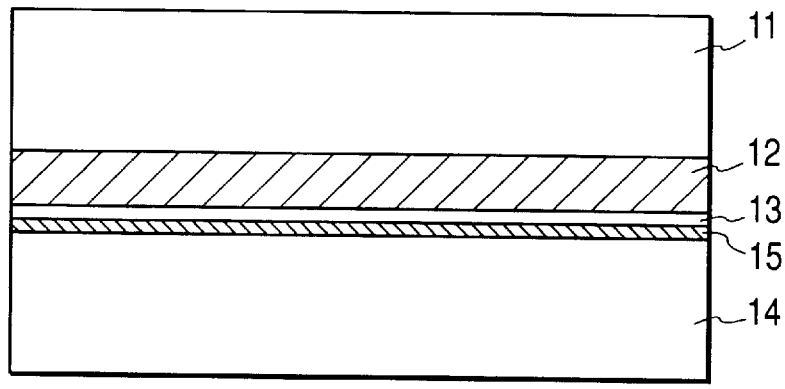
FIGS. 1A, 1B and 1C are schematic cross sectional lateral views of a semiconductor article being manufactured by a method according to the invention, illustrating different manufacturing steps.

Now, the present invention will be described in greater detail in terms of preferred modes and different phases of carrying out the invention. However, it will be appreciated that the present invention is by no means limited thereto and covers any other modes of realizing the invention that can be used for the purpose of the invention.

Preparation of Porous Silicon

Porous Si was discovered in 1956 by Uhlir et al. who were studying a process of electropolishing a semiconductor material (A. Uhlir, Bell Syst. Tech. J., Vol. 35,333 (1956)). Porous Si can be prepared through anodization of a Si substrate in an HF solution. Unagami reports as a result of his study on the dissolutive reaction of Si in a Si anodization process that the existence of holes is required for anodization of Si and the reaction proceeds in a manner as described below (T. Unagami, J. Electrochem. Soc., Vol. 127,476 (1980)).

$$Si30\ 2HF+(2-n)e^+ \rightarrow SiF_2+2H^++ne^-$$

$$SiF_2+2HF \rightarrow SiF_4+H_2$$

$$SiF_4+2HF \rightarrow H_2SiF_6$$

or $$Si+4HF+(4-\lambda)e^+ \rightarrow SiF_4+4H^++\lambda e^-$$

$$SiF_4+2HF \rightarrow H_2SiF_6$$

where $e^+$ and $e^-$ represent respectively a hole and an electron and n and k represent respective numbers of holes required for dissolving a single Si atom. The report says that porous Si is formed when the condition of n>2 or $\lambda$>4 is met.

Although a conclusion that can be drawn from the above is that P-type Si can be made porous under the existence of holes whereas N-type Si cannot be made porous, in reality, both N-type Si and P-type Ni can be turned porous under certain conditions.

According to the invention, single crystal porous Si can be formed through anodization of a single crystal Si substrate typically in a HF solution. A porous Si layer shows a spongy structure where pores with a diameter between $10^{-1}$ and 10 nm are arranged with intervals between $10^{-1}$ and 10 nm. The density of porous Si can be made to vary between 2.1 and 0.6 g/cm³ by varying the concentration of the HF solution between 50 and 20% and/or by varying the current density in contrast to the density of single crystal Si that is equal to 2.33 g/cm³. In other words, the porosity of porous Si is variable. While porous Si can be made to show a density less than a half of that of single crystal Si, it maintains the properties as single crystal Si so that a single crystal Si layer can be formed by epitaxial growth on a porous Si layer.

A porous Si layer has a density that is less than the density of a single crystal Si layer because it contains a large number of voids in the inside. Consequently, a porous Si layer shows a dramatically large surface area relative to the volume it occupies. This means that a porous Si layer can be etched at a rate by far greater than the rate at which an ordinary single crystal Si layer is normally etched.

While porous Si shows a mechanical strength that varies depending on its porosity, it is presumably lower than that of bulk Si. For instance, if a porous Si layer shows a porosity of 50%, it may be safe to assume that its mechanical strength is about a half of that of a comparable bulk Si layer. In other words, when a wafer formed by bonding a pair of substrates is subjected to compressive, tensile or shearing force, the porous Si layer arranged therebetween will be destroyed first. If the layer has a large porosity, it will be destroyed with little effort.

There are reports saying that micro-cavities having a diameter between several nanometers and tens of several namometers can be formed in a piece of bulk Si to a concentration of $10^{16-17}/cm^3$ by implanting helium or hydrogen ions and heat treating the piece particularly in the area where ions are implanted (see, inter alia, A. Van Veen, C. C. Griffioen and J. H. Evans, Mat. Res. Soc. Symp. Proc. 107 (1988, Material Res. Soc. Pittsburgh, Pa.) p. 449). Recently, research is being conducted for utilizing a group of micro-cavities for a gettering site of a metal impurity.

In an experiment conducted by V. Raineri and S. U. Campisano, helium ions were implanted into a substrate of bulk Si, which was then heat treated to form a group of micro-cavities therein and subsequently subjected to an oxidation process where a groove was formed in the substrate to expose a lateral side of the micro-cavity group. They report that the micro-cavity group was selectively oxidized to produce a buried Si oxide layer, which showed an SOI structure (V. Raineri and S. U. Campisano, Appl. Phys. Lett. 66 (1995) p. 3654). However, with the technique they employed, the thickness of the surface Si layer and that of the buried Si oxide layer are limited to respective ranges that allow both the formation of a micro-cavity group and relaxation of the stress generated by the increased volume at the time of oxidation and an operation of forming a groove is necessary for selective oxidation so that a SOI structure cannot be produced on the entire surface of the substrate.

Nonporous Semiconductor Layer

For the purpose of the present invention, a nonporous semiconductor layer can be formed preferably by using a material selected from single crystal Si, polycrystalline Si, noncrystalline Si and compound semiconductors including GaAs, InP, GaAsP, GaAlAs, InAs, AlGaSb, InGaAs, ZnS, CdSe, CdTe and SiGe. A nonporous semiconductor layer that can be used for the purpose of the present invention may substantially contain one or more than one FETs (field effect transistors).

First Substrate

For the purpose of the present invention, the first substrate includes a silicon substrate having therein a porous silicon layer and carrying a nonporous semiconductor layer arranged on the porous silicon layer. An insulation layer such as SiN, $SiO_2$ may be formed on the nonporous semiconductor layer. It may be prepared by forming a nonporous semiconductor layer on the porous silicon layer in the silicon substrate or by forming a porous silicon layer in part of a silicon substrate having therein a nonporous semiconductor layer.

A nonporous semiconductor layer can be formed on a porous silicon layer typically by means of a CVD technique selected from vacuum CVD, plasma CVD, photo CVD and MO CVD (metal-organic CVD), a sputtering technique (including a bias sputtering technique), a molecular beam epitaxial growth technique or a liquid phase growth technique.

Second Substrate

For the purpose of the present invention, the second substrate onto which the nonporous semiconductor layer is transferred from the first substrate may be selected from a semiconductor substrate such as a single crystal silicon substrate, a semiconductor substrate carrying an insulation film such as an oxide film (including a thermally oxidized film) or a nitride film on the surface thereof, a light transmitting substrate such as a silica glass substrate or a glass substrate, a metal substrate and an insulating substrate typically made of alumina depending on the application of the finally prepared semiconductor article.

Bonding

For the purpose of the invention, the first and second substrates are bonded to each other to form a multilayer structure with the nonporous semiconductor layer located inside. The multilayer structure may contain an insulation layer between the nonporous semiconductor layer and the second substrate. The first and second substrates can be firmly bonded together typically at room temperature by smoothing their bonding surfaces. Additionally, techniques including anodic bonding, pressurization and thermal treatment may appropriately be used to improve the bonding strength.

Heating of the Multilayer Structure

For the purpose of the invention, the multilayer structure obtained by bonding a first substrate having a porous silicon layer and a nonporous semiconductor layer and a second substrate (in such a way that the nonporous semiconductor layer is located inside) is separated along the porous silicon layer in order to transfer the nonporous semiconductor layer onto the second substrate by heating the multilayer structure. In the heating process, the entire multilayer structure may be heated or, alternatively, only a specific part of the multilayer structure such as the porous silicon layer may selectively be heated. The specific heating means that can be used for the purpose of the invention may be a furnace (e.g., a heat treatment furnace) for heating the multilayer structure to about 600 to 1,200° C. or a laser irradiation apparatus for causing a specific layer to absorb the irradiated laser energy and become heated without heating the remaining areas of the multilayer structure. Such a laser apparatus may use a laser beam having a wavelength that is absorbed only by the porous Si layer or a layer located close to the porous Si layer and hence adapted for local heating.

Another feasible local heating arrangement may be the use of an electric current that is made to flow along the porous Si layer or a layer located close to the porous Si layer in order to heat the porous Si layer.

Removal of the Porous Layer

After separating the multilayer structure that has been prepared by bonding first and second substrates together along the porous Si layer, the residual porous Si remaining on the substrates can be selectively removed on the basis that the porous Si layer has a low mechanical strength and a large surface area. Methods that can be used for selectively removing the remaining porous Si include mechanical techniques such as scraping and polishing, chemical etching using an etching solution and ion etching (such as reactive ion etching).

Etching solutions that can be used for a process of selectively removing the porous Si by means of an etching solution include, beside a mixture solution of 49% hydrofluoric acid and 30% aqueous hydrogen peroxide, hydrofluoric acid, a mixture solution obtained by adding alcohol to hydrofluoric acid, a mixture solution obtained by adding alcohol and aqueous hydrogen peroxide to hydrofluoric acid, buffered hydrofluoric acid, a mixture solution obtained by adding alcohol to buffered hydrofluoric acid, a mixture solution obtained by adding aqueous hydrogen peroxide to buffered hydrofluoric acid, a mixture solution obtained by adding alcohol and aqueous hydrogen peroxide to buffered hydrofluoric acid and a mixture solution of hydrofluoric acid, nitric acid and acetic acid.

The semiconductor article having the transferred nonporous semiconductor layer may preferably be heat treated in a hydrogen-containing atmosphere, subsequently to the selective removal of the porous layer, to improve the flatness of the nonporous semiconductor layer.

Now, the present invention will be described by referring to the accompanying drawings that illustrate preferred modes of carrying out the invention.

First Mode of Carrying out the Invention

In this mode of carrying out the invention, to begin with, at least a single nonporous thin film 13 is formed on the principal surface of a first single crystal Si substrate 11 with a porous Si layer 12 formed right under the nonporous thin film 13. The nonporous thin film 13 and the porous Si layer 12 can be formed by any of the techniques as listed below:

a) forming a porous Si layer 12 by anodization and subsequently forming a nonporous thin film 13 on the porous Si layer;

b) forming a porous Si layer 12 and a nonporous thin film 13 simultaneously by implanting ions of at least one of a rare gas element, hydrogen and nitrogen; and c) implanting ions of at least one of a rare gas element, hydrogen and nitrogen in addition to the technique of a) above to form regions with different porosities.

The nonporous thin film 13 may comprise single crystal Si, polycrystalline Si, noncrystalline Si, metal film, compound semiconductor thin film or superconductive thin film. It may additionally comprise a device structure containing one or more than one devices such as MOSFETs. The surface level of the bonding interface can be separated from the active layer preferably by additionally forming an uppermost $SiO_2$ layer. If the layer implanted with ions is observed through a transmission electron microscope, it will be found that there are numerous micro-cavities. The charged state of ions being implanted does not matter for the purpose of the invention. The acceleration energy applied to ions being implanted will be so controlled that their projection range matches the desired depth of ion implantation. While the size and the concentration of the micro-cavities may vary depending on the rate of ion implantation, ions are preferably implanted at a rate greater than about $1 \times 10^{14}/cm^2$ and preferably greater than $1 \times 10^{15}/cm^2$. For achieving a long projection range, a channeling ion implantation technique may be used. After the ion implantation, the multilayer structure is subjected to a heat treatment process whenever necessary. Referring to FIG. 1A, a surface of the second substrate 14 and a corresponding surface of the first substrate are brought into close contact at room temperature so that they may be bonded together. Subsequently, the bonding strength between the two substrates can be intensified by means of anode junctioning, pressurization, heat treatment, if appropriate, or a combination of any of these.

When a single crystal Si layer is produced by deposition, preferably silicon oxide is formed on the surface of the single crystal Si layer, typically by thermal oxidation, before the substrates are bonded together. While the second substrate may preferably be a Si substrate with or without a Si oxide film formed on the surface thereof, a light transmitting substrate typically made of quartz or a sapphire substrate, other appropriate substrates may alternatively be used for the second substrate so long as the surface to be bonded to the first substrate is sufficiently flat. While FIG. 1A shows a second substrate bonded to a first substrate with an insulation layer 15 arranged therebetween, the insulation layer 15 may be omitted when the nonporous thin film 13 or the second substrate is not made of Si. A thin insulating panel may be arranged between the first and second substrates when bonding them together.

When the nonporous thin film is made of epitaxially grown single crystal silicon or some other similar material, the pores inside the porous Si layer can be rearranged and closed to reduce the etchability of the porous Si layer at the time of etching if it is subjected to heat treatment during the process of epitaxial growth or in a subsequent process. In order to avoid this problem and improve the structural stability of the porous layer, the porous Si layer is preferably subjected to a preliminary heat treatment operation that is conducted at temperature between 200 and 700° C. to form a thin oxide film on the wall surface of the pores (while maintaining the properties of porous single crystal silicon) and prevent any possible rearrangement of the pores.

A step as will be described below can be employed to produce an epitaxial silicon film that is substantially free from defects.

While a porous Si layer maintains the structure of single crystal silicon, the epitaxial silicon film formed on the surface can show defects attributable to the numerous pores existing on the surface of the porous Si layer. Therefore, it may be a good idea to hermetically close the surface of the porous Si layer that is brought into contact with the epitaxial film by means of single crystal Si.

A technique that can be used for hermetically closing the surface of the porous Si layer is a heat treatment operation to be conducted in a hydrogen-containing atmosphere. As a result of this heat treatment using hydrogen, some of the silicon atoms on the surface of the porous Si layer will be migrated to hermetically close the pores exposed to the surface of the porous Si layer. This heat treatment operation is typically conducted at temperature between 500 and 1,300° C., preferably between 900 and 1,300° C.

Apart from this technique, it may also be effective to form a silicon film on the surface of the porous Si layer at a very low rate to close the pores exposed to the surface of the layer by allowing gas that contains silicon atoms to flow into the film forming chamber.

In the above described process of closing the pores exposed to the surface of the porous Si layer and forming a silicon film by epitaxial growth after the formation of a thin oxide film on the wall surface of the pores, the single crystal is preferably exposed at the top of the porous Si layer to effectively close the pores. The single crystal can be exposed by immersing the upper surface of the porous Si layer whose pores have been coated with thin oxide film in an acid such as HF to remove the thin oxide film arranged on the upper surface.

Figure 1B:
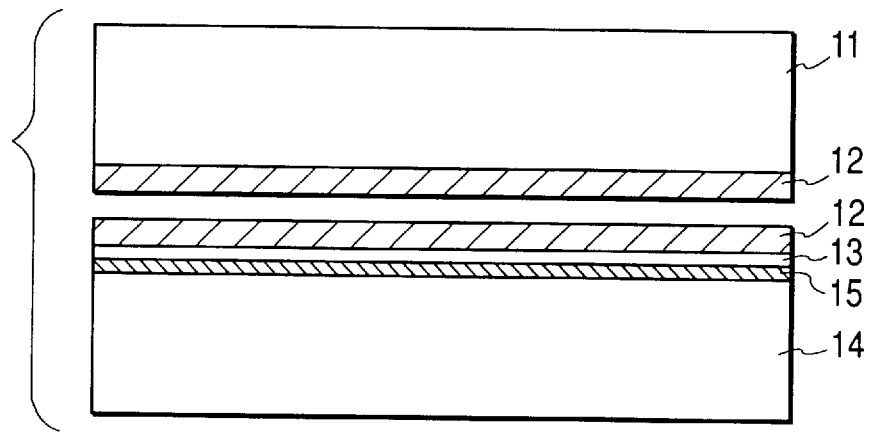

Thereafter, the entire substrate (multilayer structure) obtained by bonding the first and second substrate, the porous Si layer thereof or a layer located close to the Si layer is heated to separate the component substrates along the porous Si layer by means of the generated thermal stress or by making use of the softened porous Si layer (FIG. 1B). To achieve the separation, the entire substrate may be heated in a heat treatment furnace. Alternatively, the porous Si layer or a layer located close to the porous Si layer may be locally heated by irradiating it with a laser beam having a wavelength that can cause it to efficiently absorb the laser energy. Still alternatively, the porous Si layer can be heated by causing an electric current to flow along the plane of the porous Si layer or a layer located close to the porous Si layer.

Thereafter, the porous Si layer 12 is selectively removed. If the nonporous thin film is made of single crystal Si, only the porous Si layer 12 is etched off by nonelectrolytic wet chemical etching by using an etching solution prepared for ordinary Si etching, hydrofluoric acid that is an etching solution for selectively etching porous Si, a mixture solution obtained by adding at least either alcohol or aqueous hydrogen peroxide to hydrofluoric acid, buffered hydrofluoric acid or a mixture solution obtained by adding at least either alcohol or aqueous hydrogen peroxide to buffered hydrofluoric acid in order to leave on the second substrate the film that has been formed on the porous layer of the first substrate. As described above in detail, it is possible to selectively etch only the porous Si by means of an etching solution prepared for ordinary Si etching because of the large surface area of the porous Si layer 12. Alternatively, the porous Si layer may be selectively removed by polishing it, using the nonporous thin film layer 13 as a polishing stopper.

When a compound semiconductor layer is formed on the porous Si layer, an etching solution that provides a high Si etching rate relative to the compound semiconductor is used to chemically etch only the porous Si layer 12, leaving the thin single crystal compound semiconductor film layer 13 on the second substrate 14. Alternatively, the porous Si layer 12 may be selectively removed by polishing it, using the single crystal compound semiconductor layer 13 as a polishing stopper.

Figure 1C:
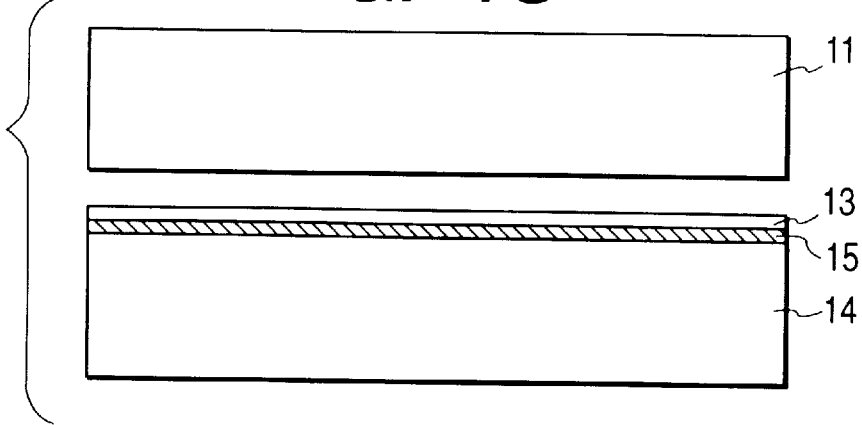

FIG. 1C shows a semiconductor article that can be produced by a method according to the invention. A large nonporous thin film which is typically a single crystal Si thin film 13 is evenly and thinly formed on the entire surface of the second substrate 14. If an insulating substrate is used for the second substrate 14, the prepared semiconductor substrate can advantageously be used for producing electronic devices that are insulated and separated from each other.

Once the residual porous Si on the first single crystal Si substrate 11 is removed from the latter, the latter can be used as another first single crystal Si substrate 11 or as another second substrate 14 after smoothing the surface if the surface has turned impermissibly coarse and such a smoothing operation is necessary.

Second Mode of Carrying out the Invention

Figure 2A:
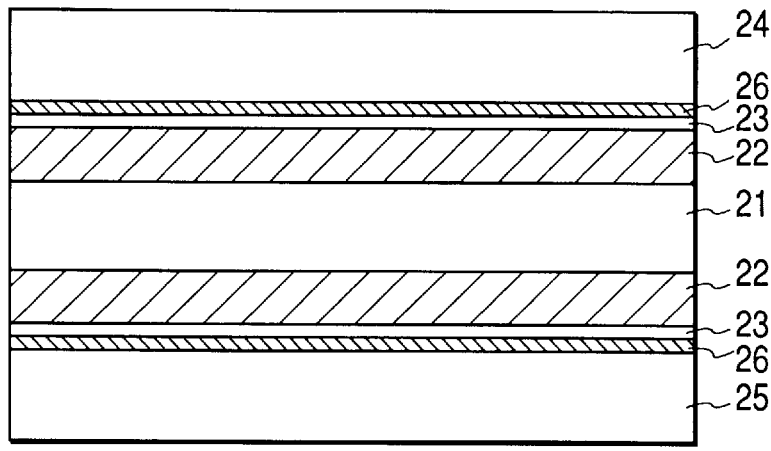
FIGS. 2A, 2B and 2C are schematic cross-sectional lateral views of a semiconductor article being manufactured by a method according to the invention, illustrating different manufacturing steps in another mode of carrying out the invention.
Figure 2B:
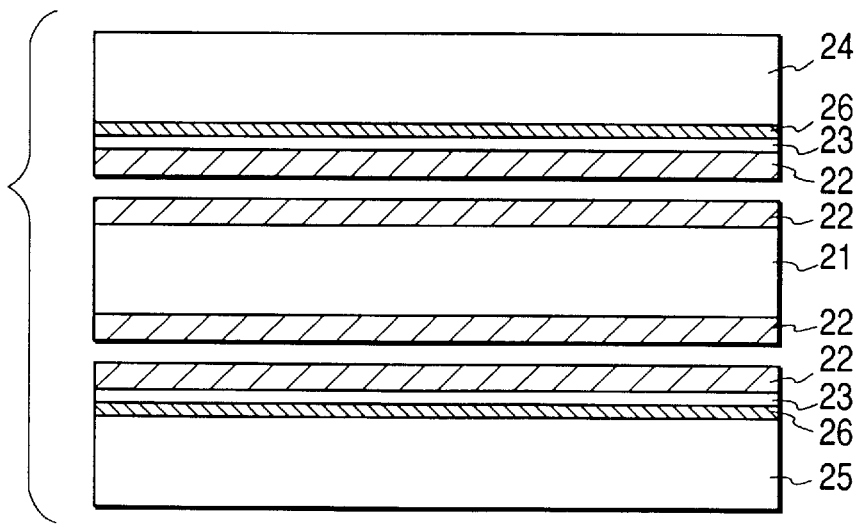
Figure 2C:
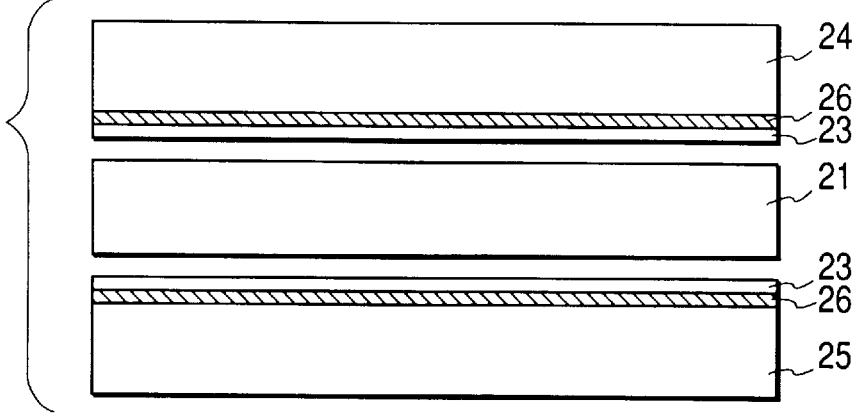
Figure 3A:
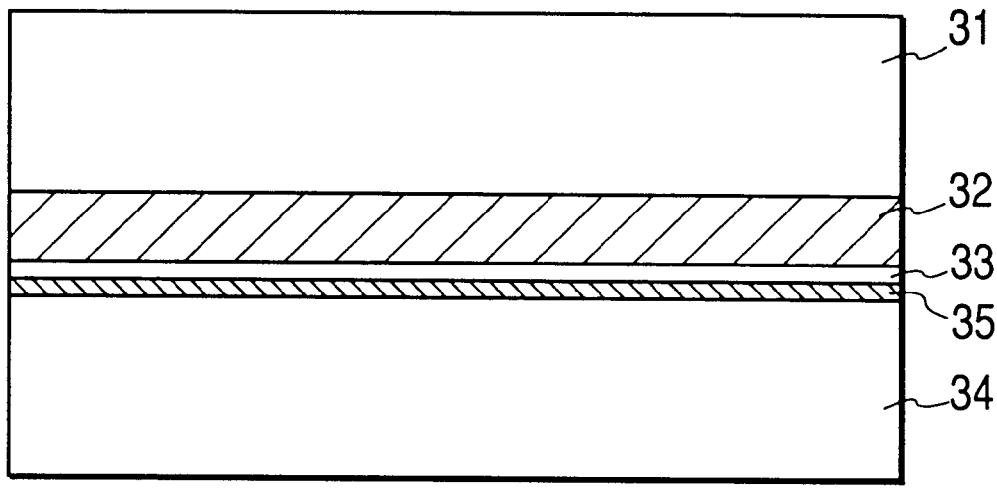
FIGS. 3A, 3B and 3C are schematic cross sectional lateral views of a semiconductor article being manufactured by a first known method.
Figure 3B:
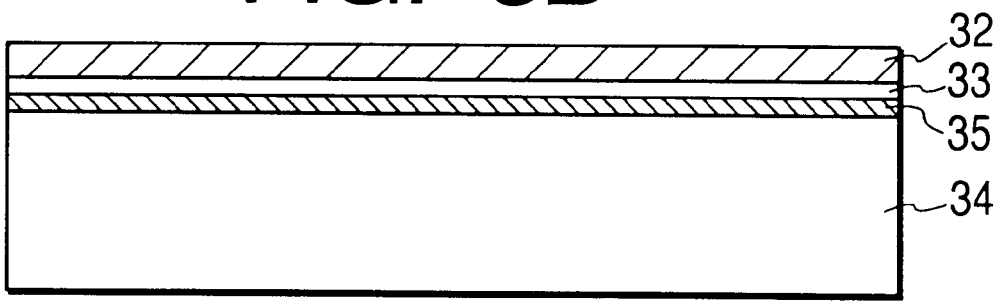
Figure 3C:
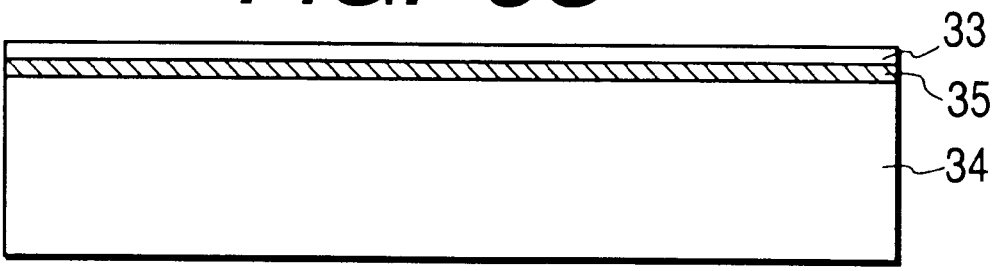
Figure 4A:
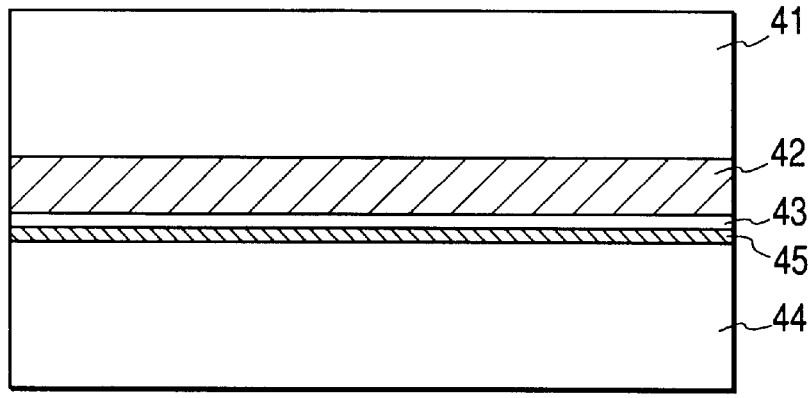
FIGS. 4A, 4B and 4C are schematic cross sectional lateral views of a semiconductor article being manufactured by a second known method.
Figure 4B:
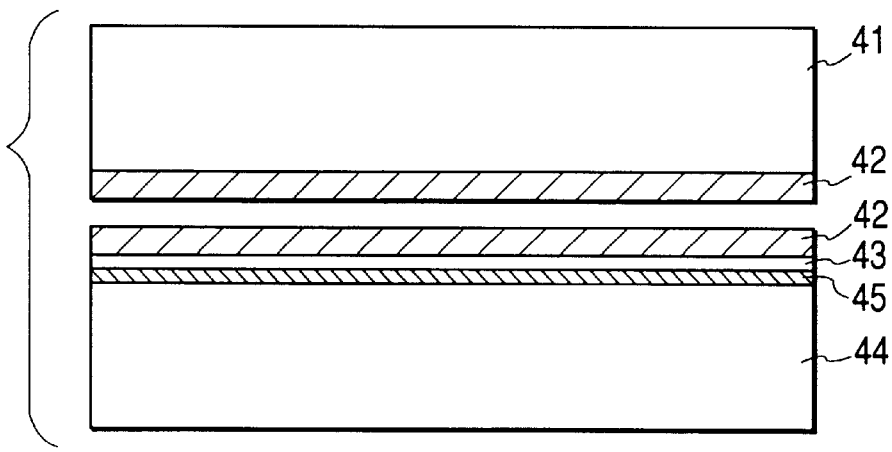
Figure 4C:
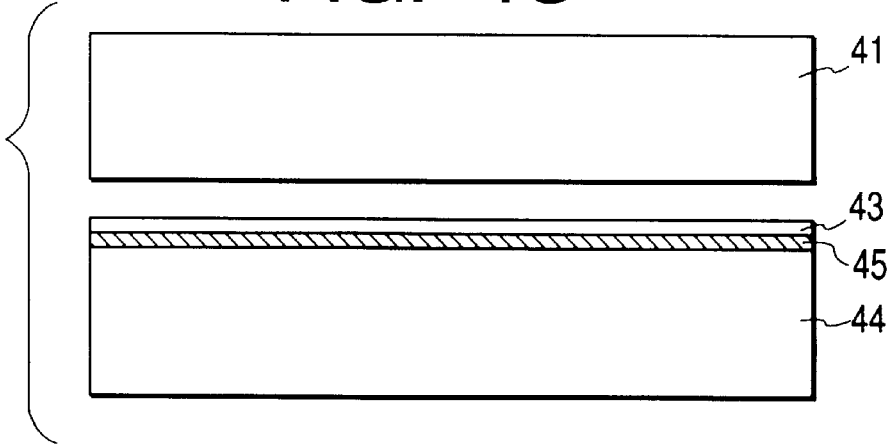

FIGS. 2A through 2C illustrate a second mode of carrying out the invention. As shown, a porous Si layer 22 and a nonporous thin film 23 are formed on each of the opposite surfaces of a first single crystal Si substrate 21 and second substrates 24, 25 are bonded to the respective surfaces with an insulation layer 26 arranged between each of the second substrates and the first substrate so that a pair of multilayer structures are produced in a single process. Otherwise, the manufacturing steps of this mode are identical with those of the above-described first mode.

Once the residual porous Si on the first single crystal Si substrate 21 is removed from the latter, the latter can be used as another first single crystal Si substrate 21 or as another second substrate 24 (or 25) after smoothing out the surface if the surface has turned impermissibly coarse and such a smoothing operation is necessary.

The support substrates 24, 25 may have respective thicknesses that are different from each other. The nonporous thin films 23 on the opposite surfaces of the first substrate may be made of respective materials and have respective thicknesses that are different from each other.

Now, the present invention will be described further by way of examples.

EXAMPLE 1

The surface layer of a first single crystal Si substrate was subjected to anodization in a HF solution. The anodization was conducted under the following conditions.

current density: 7 (mA.cm$^{-2}$)

anodization solution: HF:H$_2$O:C$_2$H$_5$OH=1:1:1 duration: 11 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with a thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: SiH$_2$Cl$_2$/ H$_2$ gas flow rate: 0.5/180 l/min.

gas pressure: 80 Torr temperature: 950° C.

growth rate: 0.3 $\mu$m/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying a 500 nm thick SiO$_2$ layer thereon and prepared in advance were brought into contact with each other and put together to produce a multilayer structure.

After removing the oxide film on the rear surface of the first substrate, a CO$_2$ laser beam was irradiated on the entire first substrate side surface of the wafer with an output power level of 500 to 1,000 W. The CO$_2$ laser was absorbed by the 500 nm thick SiO$_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

The rate of etching nonporous single crystal Si by means of the above cited etching solution is very low and the selectivity ratio of the rate of etching porous Si relative to that of etching nonporous single crystal Si is as large as more than 10$^5$ so that the reduction by etching of the height of the nonporous layer (about tens of several angstroms) is practically negligible.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the root mean square of the surface roughness (Rrms) within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another oxide film forming process as a second substrate.

EXAMPLE 2

The surface layer of a first single crystal Si substrate was subjected to anodization in a HF solution. The anodization was conducted under the following conditions.

current density: 7 (mA.cm$^{-2}$)

anodization solution: HF:H$_2$O:C$_2$H$_5$OH=1:1:1 duration: 11 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with a thermally oxidized film of silicon. P$^+$ single crystal Si was made to epitaxially grow to a thickness of 0.15 $\mu$m on the porous Si layer by means of a CVD (chemical vapor deposition) technique. This operation was conducted under the following conditions. B$_2$H$_6$ was introduced as impurity gas.

source gas: SiH$_2$Cl$_2$/H$_2$ gas flow rate: 0.5/180 l/min.

gas pressure: 80 Torr temperature: 950° C.

growth rate: 0.3 $\mu$m/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying a 500 nm thick SiO$_2$ layer thereon and prepared in advance were brought into contact with each other and put together.

An electric current of about 10 to 100 A was made to flow only through the high concentration P$^+$ single crystal Si layer of the first substrate (the impurity concentration of the high concentration P$^+$ single crystal Si layer may be such that it can reduce the electric resistance of the layer to allow the electric current to flow therethrough). The electric current was made to flow by removing the SiO$_2$ to expose the high concentration P$^+$ single crystal Si layer at an end surface of the wafer and pinching the wafer by means of + and − electrodes that touch only the end surface. As a result, the underlying porous Si layer was abruptly subjected to thermal stress to sever the two substrates along the underlying porous Si layer. For the purpose of the invention, the electric current may be a continuous current or a pulse current.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another oxide film forming process as a second substrate.

EXAMPLE 3

The surface layer of a first single crystal Si substrate was subjected to anodization in HF solution. The anodization was conducted under the following conditions.

current density: 7 (mA.cm$^{-2}$)

anodization solution: HF:H$_2$O:C$_2$H$_5$OH=1:1:1 duration: 11 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with a thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: SiH$_2$Cl$_2$/H$_2$ gas flow rate: 0.5/180 l/min.

gas pressure: 80 Torr temperature: 950° C.

growth rate: 0.3 $\mu$m/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) carrying a 500 nm thick SiO$_2$ layer thereon and prepared in advance were exposed to nitrogen plasma (in order to improve the bonding strength) and then laid one on the other to bring them into contact with each other. The combined substrates were then annealed at 400° C. for 10 hours.

After removing the oxide film on the rear surface of the first substrate, a CO$_2$ laser beam was irradiated on the entire first substrate side surface of the wafer with an output power level of 500 to 1,000 W. The CO$_2$ laser was absorbed by the 500 nm thick SiO$_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on the second substrate was selectively etched off in an etching solution of HF/HNO$_3$/CH$_3$COOH type. The single crystal Si was left unetched and operated as an etching stopper so that the porous Si was selectively etched and removed completely.

The rate of etching nonporous single crystal Si by means of the above cited etching solution is very low and the reduction by etching of the height of the nonporous layer is practically negligible.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in an HF/HNO$_3$/CH$_3$COOH type etching solution. The single crystal Si was left unetched and operated as etching stopper so that the porous Si was selectively etched and removed completely and the first substrate could be used for another anodization process or for another oxide film forming process as a second substrate.

EXAMPLE 4

The surface layer of a first single crystal Si substrate was subjected to anodization in an HF solution. The anodization was conducted under the following conditions.

current density: 7 (mA.cm$^{-2}$)

anodization solution: HF:H$_2$O:C$_2$H$_5$OH=1:1:1 duration: 11 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with a thermally oxidized film of silicon. P$^+$ single crystal Si was made to epitaxially grow to a thickness of 0.15 $\mu$m on the porous Si layer by means of a CVD (chemical vapor deposition) technique. This operation was conducted under the following conditions. B$_2$H$_6$ was introduced as impurity gas.

source gas: SiH$_2$Cl$_2$/H$_2$ gas flow rate: 0.5/180 l/min.

gas pressure: 80 Torr temperature: 950° C.

growth rate: 0.3 $\mu$m/min.

Additionally, a SiO$_2$ layer was formed to a thickness of 100 nm by thermally oxidizing the surface of the epitaxially grown Si layer.

The surface of the SiO$_2$ layer and the corresponding surface of of an Si substrate (second substrate) carrying a 500 nm thick $SiO_2$ layer thereon and prepared in advance were brought into contact with each other and put together.

An electric current of about 10 to 100 A was made to flow only through the high concentration P+ single crystal Si layer of the first substrate (the impurity concentration of the high concentration P+ single crystal Si layer may be such that it can reduce the electric resistance of the layer to allow the electric current to flow therethrough). The electric current was made to flow by removing the $SiO_2$ to expose the high concentration P+ single crystal Si layer at an end surface of the wafer and pinching the wafer by means of + and − electrodes that touch only the end surface. As a result, the underlying porous Si layer was abruptly subjected to thermal stress to sever the two substrates along the underlying porous Si layer. For the purpose of the invention, the electric current may be a continuous current or a pulse current.

Thereafter, the residual porous Si layer on the second substrate was selectively polished. The single crystal Si was left unpolished and operated as an etching stopper so that the porous Si was selectively polished and removed completely.

The rate of polishing the nonporous single crystal Si was very low and the reduction by polishing of the height of the nonporous layer (about tens of several angstroms) is practically negligible.

Thus, a single crystal Si layer was formed to a thickness of 0.1 μm on the silicon oxide film. The
    thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively polished off. The single crystal Si was left unpolished and operated as etching stopper so that the porous Si was selectively polished and removed completely and the first substrate could be used for another anodization process or for another oxide film forming process as a second substrate.

EXAMPLE 5

The surface layer of a first single crystal Si substrate was subjected to anodization in a HF solution. The anodization was conducted under the following conditions.
    current density: 7 (mA.cm$^{-2}$)
    anodization solution: $HF:H_2O:C_2H_5OH=1:1:1$
    duration: 11 (min.)
    thickness of the porous Si layer: 12 (μm)

The substrate was then oxidized at 400° C. for an hour in an oxygen atmosphere. As a result of the oxidation, the wall surfaces of the pores of the porous Si were covered with a thermally oxidized film of silicon. P+ single crystal Si was made to epitaxially grow to a thickness of 0.15 μm on the porous Si layer by means of a CVD (chemical vapor deposition) technique. This operation was conducted under the following conditions. $B_2H_6$ was introduced as impurity gas.

source gas: $SiH_2Cl_2/H_2$
    gas flow rate: 0.5/180 l/min.
    gas pressure: 80 Torr
    temperature: 950° C.
    growth rate: 0.3 μm/min.

Additionally, a $SiO_2$ layer was formed to a thickness of 100 nm by thermally oxidizing the surface of the epitaxially grown Si layer.

The surface of the $SiO_2$ layer and the corresponding surface of a quartz substrate (second substrate) prepared in advance were exposed to nitrogen plasma and then put together to bring them into contact with each other. The combined substrates were then annealed at 200° C. for 10 hours.

An electric current of about 10 to 100 A was made to flow only through the high concentration P+ single crystal Si layer of the first substrate (the impurity concentration of the high concentration P+ single crystal Si layer may be such that it can reduce the electric resistance of the layer to allow the electric current to flow therethrough). The electric current was made to flow by removing the $SiO_2$ to expose the high concentration P+ single crystal Si layer at an end surface of the wafer and pinching the wafer by means of + and − electrodes that touch only the end surface. As a result, the underlying porous Si layer was abruptly subjected to thermal stress to sever the two substrates along the underlying porous Si layer. For the purpose of the invention, the electric current may be a continuous current or a pulse current.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process.

EXAMPLE 6

The surface layer of a first single crystal Si substrate was subjected to anodization in a HF solution. The anodization was conducted under the following conditions.
    current density: 7 (mA.cm$^{-2}$)

anodization solution: HF:H$_2$O:C$_2$H$_5$OH=1:1:1 duration: 11 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with thermally oxidized film of silicon. Single crystal GaAs was made to epitaxially grow to a thickness of 1 $\mu$m on the porous Si layer by means of a CVD (chemical vapor deposition) technique. This operation was conducted under the following conditions.

source gas: TMG/AsH$_3$/H$_2$ gas pressure: 80 Torr temperature: 700° C.

The surface of the GaAs layer and the corresponding surface of a Si substrate (second substrate) prepared in advance were brought into contact with each other and put together.

After removing the oxide film on the rear surface of the first substrate, a CO$_2$ laser beam was irradiated on the entire first substrate side surface of the wafer with an output power level of 500 to 1,000 W. The CO$_2$ laser was absorbed by the GaAs layer to rapidly raise the temperature of the nearby porous Si layer until the two substrate were separated from each other along the underlying porous Si layer due to the thermal stress rapidly generated in the underlying porous Si layer. For the purpose of the invention, the laser beam may be a continuous laser or a pulse laser beam.

Thereafter, the residual porous Si layer on the second substrate was etched off by means of:

ethylenediamine+pyrocatechol+water (at a ratio of 17 ml:3 g:8 ml) at 110° C.

The single crystal GaAs was left unetched and operated as an etching stopper so that the porous Si and the oxidized porous Si were selectively etched and removed completely.

The rate of etching nonporous single crystal GaAs by means of the above cited etching solution is very low and the reduction by etching of the height of the nonporous layer (about tens of several angstroms) is practically negligible.

Thus, a single crystal GaAs layer was formed to a thickness of 1 $\mu$m on silicon. The thickness of the formed single crystal GaAs layer was observed at 100 points spreading over the entire surface of the substrate to find that the degree of uniformity of the film thickness was 1 $\mu$m±29.8 nm.

When a cross section was observed through a transmission electron microscope, it was confirmed that no new crystal defects had been introduced in the GaAs layer and an excellent degree of crystallinity had been maintained.

For the purpose of comparison, a GaAs layer was formed on an insulation film by using a Si substrate carrying thereon an oxide film as a support substrate to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another bonding process as a second substrate.

EXAMPLE 7

The surface layer of a first single crystal Si substrate was subjected to anodization in a HF solution. The anodization was conducted under the following conditions.

current density: 7 (mA.cm$^{-2}$)

anodization solution: HF:H$_2$O:C$_2$H$_5$OH=1:1:1 duration: 11 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with thermally oxidized film. Single crystal InP was made to epitaxially grow to a thickness of 1 $\mu$m on the porous Si layer by means of a MOCVD (metal organic chemical vapor deposition) technique.

The surface of the InP layer and that of a quartz substrate (second substrate) prepared in advance were brought into contact with each other and put together. The combined substrates were annealed at 200° C. for 10 hours.

After removing the oxide film on the rear surface of the first substrate, a CO$_2$ laser beam was irradiated on the entire first substrate side surface of the wafer with an output power level of 500 to 1,000 W. The CO$_2$ laser was absorbed by the InP layer to rapidly raise the temperature of the nearby porous Si layer until the two substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on the second substrate was selectively etched off in a mixture solution of 49% hydrofluoric acid and 30% aqueous hydrogen peroxide, stirring the solution constantly. The single crystal InP was left unetched and operated as etching stopper so that the porous Si was selectively etched and removed completely.

Thus, a single crystal InP layer was formed to a thickness of 1 $\mu$m on the quartz substrate. The thickness of the formed single crystal InP layer was observed at 100 points spreading over the entire surface of the substrate to find that the degree of uniformity of the film thickness was 1 $\mu$m±29.0 nm.

When a cross section was observed through a transmission electron microscope, it was confirmed that no new crystal defects had been introduced in the InP layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated an etching stopper so that the porous Si was selectively etched and removed completely and the first substrate could be used for another anodization process.

EXAMPLE 8

The surface of a first single crystal Si substrate was subjected to anodization in a HF solution on the two opposite sides thereof. The anodization was conducted under the following conditions for 11 minutes for each side.

current density: 7 (mA.cm$^{-2}$)

anodization solution: HF:H$_2$O:C$_2$H$_5$OH=1:1:1 duration: 11×2 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on each of the oppositely disposed porous Si layers by means of a CVD (chemical vapor deposition) technique. This operation was conducted under the following conditions.

source gas: $SiH_2Cl_2/H_2$ gas flow rate: 0.5/180 l/min.

gas pressure: 80 Torr temperature: 950° C.

growth rate: 0.3 $\mu$m/min.

Additionally, a $SiO_2$ layer was formed to a thickness of 100 nm by thermally oxidizing the surface of each of the epitaxially grown Si layers.

The oppositely disposed surfaces of the $SiO_2$ layer and the corresponding surfaces of a pair of Si substrates (second substrates), each carrying a 500 nm thick $SiO_2$ layer thereon and prepared in advance, were brought into contact with each other and put together.

After removing the oxide film on the rear surface of each of the second substrates, a $CO_2$ laser beam was irradiated on the entire surface of each of the second substrates of the wafer with an output power level of 500 to 1,000 W. The $CO_2$ laser was absorbed by the 500 nm thick $SiO_2$ layer arranged on the interface of the substrates on each side of the wafer to rapidly raise the temperature of the epitaxial layer and the porous Si layer that were located close to it, until the substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on each of the second substrates was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a pair of single crystal Si layers were formed to a thickness of 0.1 $\mu$m on the respective silicon oxide films. The thickness of each of the formed single crystal Si layers was observed at 100 points spreading over the entire surface of the substrate to find that the uniformity of the film thickness was 101 nm±3 nm.

Then, the wafer was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layers and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another oxide film forming process as a second substrate.

EXAMPLE 9

A $SiO_2$ layer was formed on the surface of a first single crystal Si substrate to a thickness of 100 nm by thermal oxidation. Hydrogen ions were implanted into the principal surface of the substrate to a concentration of $1 \times 10^{17}/cm^2$ with an acceleration voltage of 25 keV. As a result, a porous structure due to hydrogen bubbles was formed within the substrate and centered at a depth of 0.3 $\mu$m from the surface.

The surface of the $SiO_2$ layer of the first Si substrate and the corresponding surface of another Si substrate (second substrate) carrying a 500 nm thick $SiO_2$ layer thereon and prepared in advance were brought into contact with each other and put together.

After removing the oxide film on the rear surface of the first substrate, a $CO_2$ laser beam was irradiated on the entire first substrate side surface of the wafer with an output power level of 500 to 1,000 W. The $CO_2$ laser was absorbed by the 500 nm thick $SiO_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another anodization process or for another oxide film forming process as a second substrate.

EXAMPLE 10

The surface layer of a first single crystal Si substrate was subjected to anodization in a HF solution. The anodization was conducted under the following conditions.

current density: 7 ($mA.cm^{-2}$)

anodization solution: $HF:H_2: C_2H_5OH=1:1:1$ duration: 11 (min.)

thickness of the porous Si layer: 12 ($\mu$m)

The substrate was then oxidized at 400° C. for an hour in an oxygen atmosphere. As a result of the oxidation, the wall surfaces of the pores of the porous Si were covered with a thermally oxidized film of silicon. Single crystal Si was made to epitaxially grow to a thickness of 0.15 µm on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 µm/min.

Additionally, a $SiO_2$ layer was formed to a thickness of 100 nm by thermally oxidizing the surface of the epitaxially grown Si layer.

Hydrogen ions were implanted into the principal surface of the substrate to a concentration of $5 \times 10^{16}/cm^2$ with an acceleration voltage of 180 keV.

The surface of the $SiO_2$ layer and the corresponding surface of an Si substrate (second substrate) carrying a 500 nm thick $SiO_2$ layer thereon and prepared in advance were brought into contact with each other and put together.

After removing the oxide film on the rear surface of the first substrate, a $CO_2$ laser beam was irradiated on the entire first substrate side surface of the wafer with an output power level of 500 to 1,000 W. The $CO_2$ laser was absorbed by the 500 nm thick $SiO_2$ layer arranged on the interface of the two substrates to rapidly raise the temperature of the epitaxial layer and the porous Si layer that were located close to it, until the two substrates were separated from each other along the underlying porous Si layer due to the thermal stress rapidly generated in the underlying porous Si layer. For the purpose of the invention, the laser beam may be a continuous laser beam or a pulse laser beam. The site of separation could be substantially rigorously controlled due to the ion implantation and the substrates were separated along a depth of about 1.5 µm of the porous Si layer from the bonded surface of the $SiO_2$.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 µm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 µm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another anodization process or for another oxide film forming process as a second substrate.

EXAMPLE 11

The surface layer of a first single crystal Si substrate was subjected to anodization in an HF solution. The anodization was conducted under the following conditions.

current density: 7 $(mA.cm^{-2})$
anodization solution: $HF:H_2O:C_2H_5OH=1:1:1$
duration: 11 (min.)
thickness of the porous Si layer: 12 (µm)

The substrate was then oxidized at 400° C. for an hour in an oxygen atmosphere. As a result of the oxidation, the wall surfaces of the pores of the porous Si were covered with a thermally oxidized film of silicon. Single crystal Si was made to epitaxially grow to a thickness of 0.15 µm on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 µm/min.

Additionally, a $SiO_2$ layer was formed to a thickness of 100 nm by thermally oxidizing the surface of the epitaxially grown Si layer.

The surface of the $SiO_2$ layer and the corresponding surface of an Si substrate (second substrate) were brought into contact with each other and put together.

After removing the oxide film on the rear surface of the first substrate, a $CO_2$ laser beam was irradiated on the entire first substrate side surface of the wafer with an output power level of 500 to 1,000 W. The $CO_2$ laser was absorbed by the 500 nm thick $SiO_2$ layer arranged on the interface of the two substrates to rapidly raise the temperature of the epitaxial layer and the porous Si layer that were located close to it, until the two substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as etching stopper so that the porous Si was selectively etched and removed completely.

Thus, a single crystal Si layer was formed to a thickness of 0.1 µm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 µm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another anodization process or for another bonding process as a second substrate.

EXAMPLE 12

The surface layer of a first single crystal Si substrate was subjected to anodization in an HF solution. The anodization was conducted under the following conditions.

current density: 7 (mA.cm$^{-2}$)
anodization solution: $HF:H_2O:C_2H_5OH=1:1:1$
duration: 5.5 (min.)
thickness of the porous Si layer: 6 ($\mu$m) and subsequently
current density: 70 (mA.cm$^{-2}$)
anodization solution: $HF:H_2O:C_2H_5OH=1:1:1$
duration: 0.5 (min.)
thickness of the porous Si layer: 5 ($\mu$m)

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, a $SiO_2$ layer was formed to a thickness of 100 nm by thermally oxidizing the surface of the epitaxially grown Si layer.

The surface of the $SiO_2$ layer and the corresponding surface of a Si substrate (second substrate) were brought into contact with each other and put together.

After removing the oxide film on the rear surface of the first substrate, a $CO_2$ laser beam was irradiated on the entire first substrate side surface of the wafer with an output power level of 500 to 1,000 W. The $CO_2$ laser was absorbed by the 500 nm thick $SiO_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 $\mu$m on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 $\mu$m square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another bonding process as a second substrate.

EXAMPLE 13

The surface layer of a first single crystal Si substrate was subjected to anodization in a HF solution. The anodization was conducted under the following conditions.

current density: 7 (mA.cm$^{-2}$)
anodization solution: $HF:H_2O:C_2H_5OH=1:1:1$
duration: 3.5 (min.)
thickness of the porous Si layer: 4 ($\mu$m),
subsequently
current density: 100 (mA.cm$^{-2}$)
anodization solution: $HF:H_2O:C_2H_5OH=1:1:1$
duration: 0.2 (min.)
thickness of the porous Si layer: 3 ($\mu$m)
and then
current density: 7 (mA.cm$^{-2}$)
anodization solution: $HF:H_2O:C_2H_5OH=1:1:1$
duration: 3.5 (min.)
thickness of the porous Si layer: 4 ($\mu$m).

The substrate was then oxidized at 400° C. for an hour in an oxygen atmosphere. As a result of the oxidation, the wall surfaces of the pores of the porous Si were covered with a thermally oxidized film of silicon. Single crystal Si was made to epitaxially grow to a thickness of 0.15 $\mu$m on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 $\mu$m/min.

Additionally, a $SiO_2$ layer was formed to a thickness of 100 nm by thermally oxidizing the surface of the epitaxially grown Si layer.

The surface of the $SiO_2$ layer and the corresponding surface of a Si substrate (second substrate) were brought into contact with each other and put together.

After removing the oxide film on the rear surface of the first substrate, a $CO_2$ laser beam was irradiated on the entire first substrate side surface of the wafer with an output power level of 500 to 1,000 W. The $CO_2$ laser was absorbed by the 500 nm thick $SiO_2$ layer arranged on the interface of the two substrates to rapidly raise the temperature of the epitaxial layer and the porous Si layer that were located close to it, until the two substrates were separated from each other along the underlying porous Si layer due to the thermal stress rapidly generated in the underlying porous Si layer.

For the purpose of the invention, the laser beam may be a continuous laser beam or a pulse laser beam.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely. The first substrate could be used for another anodization process or for another bonding process as a second substrate.

EXAMPLE 14

The surface layer of a first single crystal Si substrate was subjected to anodization in a HF solution. The anodization was conducted under the following conditions.

current density: 7 (mA.cmM$^{-2}$)
anodization solution: HF:H$_2$O:C$_2$H$_5$OH=1:1:1
duration: 11 (min.)
thickness of the porous Si layer: 12 (μm)

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of an Si substrate (second substrate) were brought into contact with each other and put together for bonding.

Then, the bonded substrate were heated to about 1,250° C. in a heat treatment furnace. They were separated from each other along the underlying porous Si layer due to the thermal stress rapidly generated in the porous Si layer. For the purpose of the invention, the substrates may be subjected to another heat treatment to improve their bonding strength.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another bonding process as a second substrate.

EXAMPLE 15

The surface layer of a first single crystal Si substrate was subjected to anodization in a HF solution. The anodization was conducted under the following conditions.

current density: 7 (mA.cm$^{-2}$)
anodization solution: HF:H$_2$O:C$_2$H$_5$OH=1:1:1
duration: 11 (min.)
thickness of the porous Si layer: 12 (μm)

The substrate was then oxidized at 400° C. for an hour in an oxygen atmosphere. As a result of the oxidation, the wall surfaces of the pores of the porous Si were covered with thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of an Si substrate (second substrate) carrying a 500 nm thick SiO$_2$ layer thereon and prepared in advance were brought into contact with each other and put together for bonding.

Then, the bonded substrates were heated to about 1,250° C. in a heat treatment furnace. They were separated from each other along the underlying porous Si layer due to the thermal stress rapidly generated in the porous Si layer. For the purpose of the invention, the substrates may be subjected to another heat treatment to improve their bonding strength.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

For the purpose of comparison, a similar multilayer structure carrying no oxide film on the epitaxial Si layer was prepared to obtain the above-identified results.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another oxide film forming process as a second substrate.

EXAMPLE 16

The surface layer of a first single crystal Si substrate was subjected to anodization in a HF solution. The anodization was conducted under the following conditions.

current density: 7 (mA.cM$^{-2}$)
anodization solution: HF:H$_2$O:C$_2$H$_5$OH=1:1:1
duration: 3.5 (min.)
thickness of the porous Si layer: 4 (μm),
subsequently
current density: 100 (mA.cm$^{-2}$)
anodization solution: HF:H$_2$O:C$_2$H$_5$OH=1:1:1
duration: 0.2 (min.)
thickness of the porous Si layer: 3 (μm)
and then
current density: 7 (mA.cm$^{-2}$)
anodization solution: HF:H$_2$O:C$_2$H$_5$OH=1:1:1
duration: 3.5 (min.)
thickness of the porous Si layer: 4 (μm). T he substrate was then oxidized at 400° C. for an hour in an oxygen atmosphere. As a result of the oxidation, the wall surfaces of the pores of the porous Si were covered with a thermally oxidized film of silicon. Single crystal Si was made to epitaxially grow to a thickness of 0.15 μm on the porous Si layer by means of a CVD (chemical vapor deposition) technique. This operation was conducted under the following conditions.

source gas: SiH$_2$Cl$_2$/H$_2$
gas flow rate: 0.5/180 l/min.
gas pressure: 80 Torr
temperature: 950° C.
growth rate: 0.3 μm/min.

Additionally, a SiO$_2$ layer was formed to a thickness of 100 nm by thermally oxidizing the surface of the epitaxially grown Si layer.

The surface of the SiO$_2$ layer and the corresponding surface of a Si substrate (second substrate) were brought into contact with each other and put together for bonding.

Then, the bonded substrates were heated to about 600 to 1,200° C. in a heat treatment furnace. They were separated from each other along the porous Si layer due to the thermal stress rapidly generated in the porous Si layer. For the purpose of the invention, the substrates may be subjected to another heat treatment to improve their bonding strength.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another bonding process as a second substrate.

EXAMPLE 17

The surface layer of a first single crystal Si substrate was subjected to anodization in a HF solution. The anodization was conducted under the following conditions.

current density: 7 (mA.cm$^{-2}$)
anodization solution: HF:H$_2$O:C$_2$H$_5$OH=1:1:1
duration: 5.5 (min.)
thickness of the porous Si layer: 6 (μm),
and subsequently
current density: 70 (mA.cm$^{-2}$)
anodization solution: HF:H$_2$O:C$_2$H$_5$OH=1:1:1
duration: 0.5 (min.)
thickness of the porous Si layer: 5 (μm).

The substrate was then oxidized at 400° C. for an hour in an oxygen atmosphere. As a result of the oxidation, the wall surfaces of the pores of the porous Si were covered with thin thermally oxidized film of silicon.

Thereafter, the thin oxide film produced on the uppermost surface of the substrate where the porous layer had been formed was removed by immersing it in a 1.25% HF solution. Subsequently, the resulting substrate was subjected to heat treatment at 1,050° C. and 760 Torr for 1 minute in a flow of $H_2$ flowing at a rate of 230 l/min. and for more 5 minutes after adding $SiH_4$ by 50 sccm.

Then, single crystal Si was made to epitaxially grow to a thickness of 0.15 μm on the porous Si layer by means of a CVD (chemical vapor deposition) technique. This operation was conducted under the following conditions.

source gas: $SiH_2Cl_2/H_2$
gas flow rate: 0.5/180 l/min.
gas pressure: 80 Torr
temperature: 950° C.
growth rate: 0.3 μm/min.

Additionally, a $SiO_2$ layer was formed to a thickness of 100 nm by thermally oxidizing the surface of the epitaxially grown Si layer.

The surface of the $SiO_2$ layer and the corresponding surface of a Si substrate (second substrate) were brought into contact with each other and put together for bonding.

After removing the oxide film on the rear surface of the first substrate, a $CO_2$ laser beam was irradiated on the entire first substrate side surface of the wafer with an output power level of 500 to 1,000 W. The $CO_2$ laser was absorbed by the 500 nm thick $SiO_2$ layer arranged on the interface of the two substrates to rapidly raise the temperature of the epitaxial layer and the porous Si layer that were located close to it until the two substrates were separated from each other along the underlying porous Si layer due to the thermal stress rapidly generated in the underlying porous Si layer. For the purpose of the invention, the laser beam may be a continuous laser beam or a pulse laser beam.

Thereafter, the residual porous Si layer on the second substrate was selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely.

Thus, a single crystal Si layer was formed to a thickness of 0.1 μm on the silicon oxide film. The thickness of the formed single crystal Si layer was observed at 100 points spreading over the entire surface of the substrate to find that the uniformity of the film thickness was 101 nm±3 nm.

Then, the substrate was subjected to a heat treatment operation at 1,100° C. for an hour in a hydrogen atmosphere. The surface coarseness was observed by means of atomic force microscopy to find that the Rrms within a 50 μm square was about 0.2 nm, which is substantially equal to the corresponding value of commercially available Si wafers.

When a cross section was observed through a transmission electron microscope, it was confirmed that no new crystal defects had been introduced in the Si layer and an excellent degree of crystallinity had been maintained.

Finally, the porous Si remaining on the first substrate was also selectively etched off in a mixture solution of 49% hydrofluoric acid and 30% aqueous hydrogen peroxide, stirring the solution constantly. The single crystal Si was left unetched and operated as an etching stopper so that the porous Si was selectively etched and removed completely and the first substrate could be used for another anodization process or for another bonding process as a second substrate.

What is claimed is:

1. A method of manufacturing a semiconductor article, characterized by comprising steps of:
    preparing a first substrate including a silicon substrate having a porous silicon layer and a nonporous semiconductor layer arranged on said porous silicon layer;
    bonding said first substrate and a second substrate to produce a multilayer structure with said nonporous semiconductor layer located inside;
    separating said multilayer structure along said porous silicon layer by causing an electric current to flow through said porous silicon layer for heating said multilayer structure, so that said nonporous semiconductor layer is arranged on said separated second substrate.

2. A method of manufacturing a semiconductor article, characterized by comprising steps of:
    preparing a first substrate including a silicon substrate having a porous silicon layer and a nonporous semiconductor layer arranged on said porous silicon layer;
    bonding said first substrate and a second substrate to produce a multilayer structure with said nonporous semiconductor layer located inside;
    separating said multilayer structure along said porous silicaon layer by locally heating said porous silicon layer and its proximity, so that said nonporous semiconductor layer is arranged on said separated second substrate.

3. A method of manufacturing a semiconductor article, characterized by comprising steps of:
    preparing a first substrate including a silicon substrate having a porous silicon layer and a nonporous semiconductor layer arranged on said porous silicon layer;
    bonding said first substrate and a second substrate to produce a multilayer structure with said nonporous semiconductor layer located inside;
    separating said multilayer structure along said porous silicon layer by laser irradiation for heating said multilayer structure, so that said nonporous semiconductor layer is arranged on said separated second substrate.

4. A method of manufacturing a semiconductor article according to claims 1 or 2, wherein said heating is an operation of partly heating said multilayer structure.

5. A method of manufacturing a semiconductor article according to claim 4, wherein said laser is carbon dioxide laser.

6. A method of manufacturing a semiconductor article according to claim 5, wherein said laser is carbon dioxide laser.

7. A method of manufacturing a semiconductor article according to claim 4, wherein said heating is realized by causing an electric current to flow through said porous silicon layer.

8. A method of manufacturing a semiconductor article according to claims 1 or 2, wherein a porous silicon layer is formed on the two surfaces of said silicon substrate and thereafter a nonporous semiconductor layer is formed on the two porous silicon layers.

9. A method of manufacturing a semiconductor article according to claims 1 or 2, wherein said porous silicon layer is obtained through anodization of said silicon substrate.

10. A method of manufacturing a semiconductor article according to claims 1, 2, or 3, wherein said first substrate is made to carry thereon said porous silicon layer formed by implanting ions of an element selected from a rare gas element, hydrogen and nitrogen into said silicon substrate into an ion implantation region of said silicon substrate having a depth from the surface of said substrate and comprises a surface layer constituted by said nonporous semiconductor layer.

11. A method of manufacturing a semiconductor article according to claims 1, 2, or 3, wherein said first substrate is formed by forming said porous silicon layer in said silicon substrate and thereafter forming said nonporous semiconductor layer on said porous silicon layer.

12. A method of manufacturing a semiconductor article according to claims 1, 2, or 3, wherein said nonporous semiconductor layer is constituted by a single crystal silicon layer.

13. A method of manufacturing a semiconductor article according to claim 12, wherein said single crystal silicon layer is formed by epitaxial growth.

14. A method of manufacturing a semiconductor article according to claim 12, wherein said first substrate comprises a silicon oxide layer formed on the surface of said single crystal silicon layer.

15. A method of manufacturing a semiconductor article according to claim 14, wherein said silicon oxide layer is formed by thermal oxidation.

16. A method of manufacturing a semiconductor article according to claims 1, 2, or 3, wherein said nonporous semiconductor layer comprises a compound semiconductor layer.

17. A method of manufacturing a semiconductor article according to claim 16, wherein said compound semiconductor layer has a single crystal structure.

18. A method of manufacturing a semiconductor article according to claims 1, 2 or 3, wherein said second substrate is a single crystal silicon substrate.

19. A method of manufacturing a semiconductor article according to claims 1, 2 or 3, wherein said second substrate is prepared by forming an oxide film on a single crystal silicon substrate.

20. A method of manufacturing a semiconductor article according to claims 1, 2 or 3, wherein said second substrate is a light transmitting substrate.

21. A method of manufacturing a semiconductor article according to claim 20, wherein said light transmitting substrate is a glass substrate.

22. A method of manufacturing a semiconductor article according to claims 1, 2 or 3, wherein said bonding step is conducted by bringing said two substrate into close contact with each other.

23. A method of manufacturing a semiconductor article according to claims 1, 2 or 3, wherein said step is conducted through anodic bonding, pressurization or heat treatment.

24. A method of manufacturing a semiconductor article according to claims 1, 2 or 3, wherein said step of removing said porous silicon layer is performed by polishing said substrate.

25. A method of manufacturing a semiconductor article according to claims 1, 2 or 3, wherein said step of removing said porous silicon layer is performed by etching said substrate.

26. A method of manufacturing a semiconductor article according to claim 25, wherein said etching is conducted by using hydrofluoric acid.

27. A method of separating a semiconductor layer, comprising steps of:

preparing a first substrate including a silicon substrate having a porous silicon layer and a nonporous semiconductor layer arranged on said porous silicon layer;

bonding said first substrate and a second substrate to produce a multilayer structure with said nonporous semiconductor layer located inside;

separating said nonporous semiconductor layer from said first substrate along said porous silicon layer by laser irradiation for heating said multilayer structure.

28. A method of separating a semiconductor layer, comprising steps of:

preparing a first substrate including a silicon substrate having a porous silicon layer and a nonporous semiconductor layer arranged on said porous silicon layer;

bonding said first substrate and a second substrate to produce a multilayer structure with said nonporous semiconductor layer located inside;

separating said nonporous semiconductor layer from said first substrate along said porous silicon layer by causing an electric current to flow through said porous silicon layer for heating said multilayer structure.

29. A method of separating a semiconductor layer, comprising steps of:

preparing a first substrate including a silicon substrate having a porous silicon layer and a nonporous semiconductor layer arranged on said porous silicon layer;

bonding said first substrate and a second substrate to produce a multilayer located inside;

separating said nonporous semiconductor layer from said first substrate along said porous silicon layer by locally heating said porous silicon layer and its proximity.

* * * * *